United States Patent
Cho et al.

(10) Patent No.: US 11,551,916 B2
(45) Date of Patent: Jan. 10, 2023

(54) SHEATH AND TEMPERATURE CONTROL OF A PROCESS KIT IN A SUBSTRATE PROCESSING CHAMBER

(71) Applicant: APPLIED MATERIALS, INC., Santa Clara, CA (US)

(72) Inventors: Jaeyong Cho, San Jose, CA (US); Rajinder Dhindsa, Pleasanton, CA (US); James Rogers, Los Gatos, CA (US); Anwar Husain, Pleasonton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 65 days.

(21) Appl. No.: 16/853,600

(22) Filed: Apr. 20, 2020

(65) Prior Publication Data
US 2021/0296098 A1 Sep. 23, 2021

Related U.S. Application Data
(60) Provisional application No. 62/992,812, filed on Mar. 20, 2020.

(51) Int. Cl.
| | | |
|---|---|---|
| H01J 37/32 | (2006.01) | |
| H01L 21/683 | (2006.01) | |
| H01L 21/67 | (2006.01) | |

(52) U.S. Cl.
CPC .. *H01J 37/32724* (2013.01); *H01J 37/32642* (2013.01); *H01L 21/67069* (2013.01); *H01L 21/6833* (2013.01); *H01J 2237/334* (2013.01)

(58) Field of Classification Search
CPC .......... H01L 21/6833; H01L 21/68735; H01L 21/3065; H01L 21/67109; H01J 37/32009; H01J 37/32642
See application file for complete search history.

(56) References Cited

U.S. PATENT DOCUMENTS

| | | | | |
|---|---|---|---|---|
| 6,838,646 B2* | 1/2005 | Inazumachi | ...... | H01L 21/67109 118/724 |
| 2008/0236749 A1* | 10/2008 | Koshimizu | ....... | H01J 37/32348 156/345.33 |

(Continued)

FOREIGN PATENT DOCUMENTS

| | | |
|---|---|---|
| JP | 2005045208 A | 2/2005 |
| JP | 2018186263 A | 11/2018 |

(Continued)

OTHER PUBLICATIONS

International Search Report and Written Opinion of the International Search Report for application No. PCT/US2021/022647 dated Jul. 19, 2021.

*Primary Examiner* — Yuechuan Yu
(74) *Attorney, Agent, or Firm* — Moser Taboada (57) ABSTRACT

Embodiments of substrate supports are provided herein. In some embodiments, a substrate support for use in a substrate processing chamber includes a ceramic plate having a first side configured to support a substrate and a second side opposite the first side, wherein the ceramic plate includes an electrode embedded in the ceramic plate; a ceramic ring disposed about the ceramic plate and having a first side and a second side opposite the first side, wherein the ceramic ring includes a chucking electrode and a heating element embedded in the ceramic ring; and a cooling plate coupled to the second side of the ceramic plate and the second side of the ceramic ring, wherein the cooling plate includes a radially inner portion, a radially outer portion, and a thermal break disposed therebetween.

19 Claims, 4 Drawing Sheets

(56) References Cited

U.S. PATENT DOCUMENTS

| | | | |
|---|---|---|---|
| 2012/0238040 A1* | 9/2012 | Kubota | ............... H01L 21/3065 |
| | | | 438/5 |
| 2014/0209245 A1* | 7/2014 | Yamamoto | ........ H01J 37/32091 |
| | | | 361/234 |
| 2018/0190501 A1 | 7/2018 | Ueda | |
| 2018/0204757 A1 | 7/2018 | Fushimi | |
| 2018/0315640 A1 | 11/2018 | Ueda et al. | |
| 2019/0013232 A1 | 1/2019 | Casaes et al. | |

FOREIGN PATENT DOCUMENTS

| | | |
|---|---|---|
| WO | WO-2019088204 A1 | 5/2019 |
| WO | WO-2020054682 A1 | 3/2020 |
| WO | WO 2021158612 A1 | 8/2021 |

\* cited by examiner

FIG. 4

SHEATH AND TEMPERATURE CONTROL OF A PROCESS KIT IN A SUBSTRATE PROCESSING CHAMBER

CROSS-REFERENCE TO RELATED APPLICATIONS

This application claims benefit of U.S. provisional patent application Ser. No. 62/992,812, filed Mar. 20, 2020 which is herein incorporated by reference in its entirety.

FIELD

Embodiments of the present disclosure generally relate to substrate processing systems, and more specifically, to process kits for use in substrate processing systems.

BACKGROUND

Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma. An electrostatic chuck is used to electrostatically hold a substrate to control substrate temperature during processing. The electrostatic chuck typically includes an electrode embedded in a dielectric plate and a cooling plate disposed below the dielectric plate. A process kit can include an edge ring that is often disposed above the cooling plate and about the dielectric plate to guide a substrate.

However, when a substrate is placed in a processing chamber after a long idle time, a temperature of the edge ring goes up as substrates are processed with two different RF powers. A temperature differential between the edge ring and the dielectric plate may cause a non-uniform chemical reaction between the edge ring and process gases as compared to the dielectric plate and process gases, causing process drift.

An RF power source for creating bias is applied to the cooling plate. The inventors have observed that as a height of the edge ring comes down due to ion bombardment during substrate processing, equipotential lines in a sheath created by the bias RF power source become tilted proximate the edge ring, causing process drift.

Accordingly, the inventors have provided embodiments of improved process kits.

SUMMARY

Embodiments of substrate supports are provided herein. In some embodiments, a substrate support for use in a substrate processing chamber includes: a ceramic plate having a first side configured to support a substrate and a second side opposite the first side, wherein the ceramic plate includes an electrode embedded in the ceramic plate; a ceramic ring disposed about the ceramic plate and having a first side and a second side opposite the first side, wherein the ceramic ring includes a chucking electrode and a heating element embedded in the ceramic ring; and a cooling plate coupled to the second side of the ceramic plate and the second side of the ceramic ring, wherein the cooling plate includes a radially inner portion, a radially outer portion, and a thermal break disposed therebetween.

In some embodiments, a substrate support for use in a substrate processing chamber includes: a ceramic plate having a first side configured to support a substrate and a second side opposite the first side, wherein the ceramic plate includes an electrode and a heating element embedded in the ceramic plate; a ceramic ring disposed about the ceramic plate and having a first side and a second side opposite the first side, wherein the ceramic ring includes a chucking electrode and a heating element embedded in the ceramic ring, and wherein the ceramic ring is spaced apart from the ceramic plate; an edge ring disposed on the ceramic ring; and a cooling plate coupled to the second side of the ceramic plate and the second side of the ceramic ring.

In some embodiments, a process chamber includes a chamber body having a substrate support disposed within an inner volume of the chamber body, wherein the substrate support includes: a cooling plate having first coolant channels disposed in a radially inner portion and second coolant channels disposed in a radially outer portion, wherein the first coolant channels are fluidly independent from the second coolant channels; a ceramic plate disposed above the cooling plate and a gas channel extending from a bottom surface to a top surface of the ceramic plate; a ceramic ring coupled to the cooling plate and disposed about the ceramic plate with a gap therebetween and having a heating element and a second gas channel extending from a bottom surface to a top surface of the ceramic ring; and a power source coupled to the heating element to control a temperature of the ceramic ring independent of the temperature of the ceramic plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports and process kits for use in a substrate processing chamber are provided herein. The substrate support includes a ceramic plate having a support surface to support a substrate. The substrate support includes a process kit having a ceramic ring disposed about the ceramic plate. The process kit further includes an edge ring disposed on the ceramic ring to guide the substrate. The ceramic ring and the ceramic plate are advantageously thermally isolated from each other to provide independent temperature control.

Figure 1:
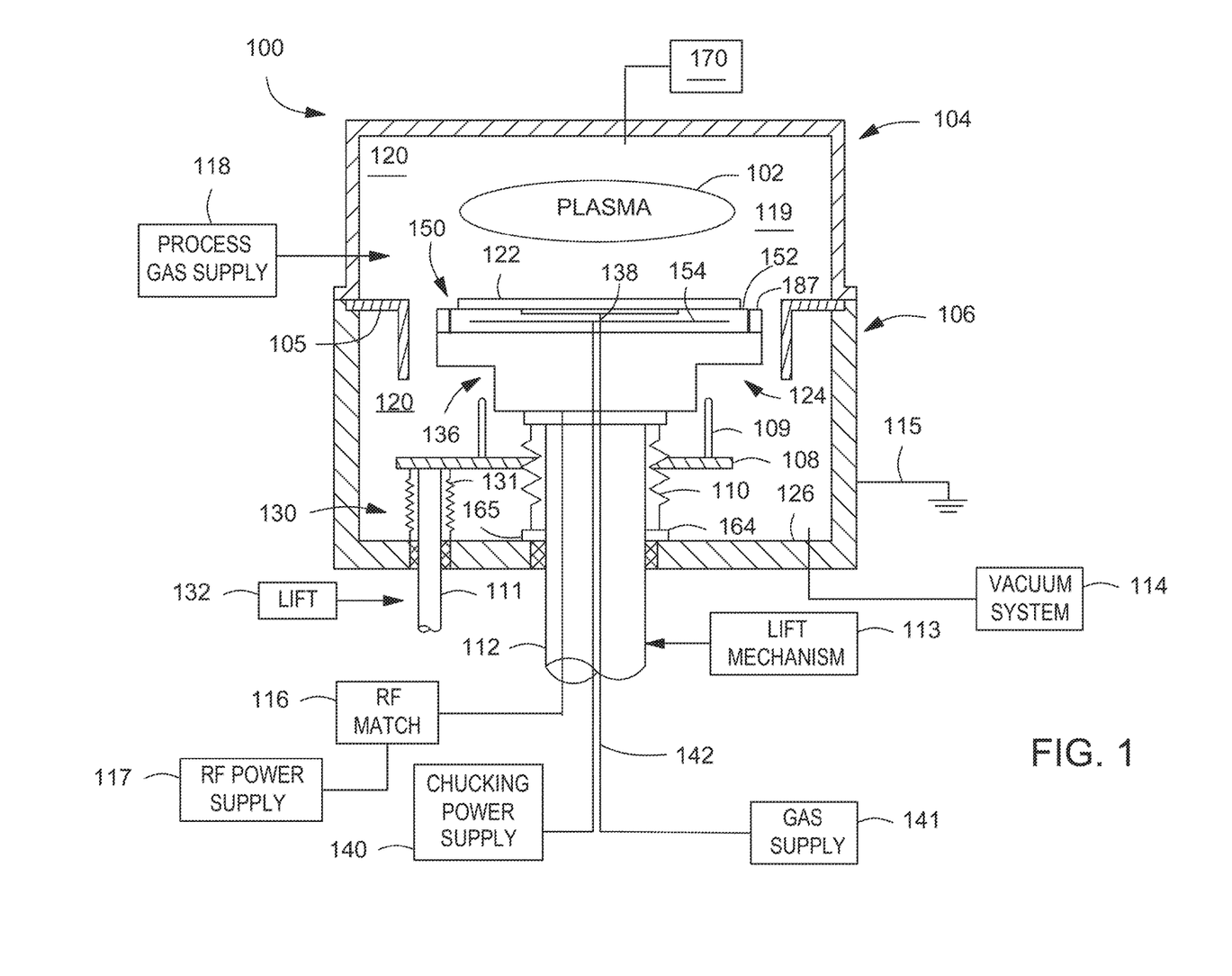
FIG. 1 depicts a schematic side view of a process chamber having a substrate support in accordance with at least some embodiments of the present disclosure.

FIG. 1 depicts a schematic side view of a process chamber (e.g., a plasma processing chamber) having a substrate support in accordance with at least some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 (described in more detail below with respect to FIGS. 2-3) and a hollow support shaft 112 for supporting the electrostatic chuck 150. The electrostatic chuck 150 comprises a ceramic plate 152 having one or more electrodes 154 disposed therein and a cooling plate 136. The hollow support shaft 112 provides a conduit to provide, for example, backside gases, process gases, fluids, coolants, power, or the like, to the electrostatic chuck 150. The substrate support 124 includes a ceramic ring 187 (described in more detail below with respect to FIGS. 2-3) disposed about the ceramic plate 152.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and a bias power supply 117) to the electrostatic chuck 150. In some embodiments, the bias power supply 117 includes one or more RF bias power sources. In some embodiments, RF energy supplied by the RF plasma power supply 170 may have a frequency of about 40 MHz or greater. The backside gas supply 141 is disposed outside of the chamber body 106 and supplies heat transfer gas to the electrostatic chuck 150. In some embodiments, a RF plasma power supply 170 and a bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include through holes to receive the lift pins 109. In some embodiments, the ceramic ring 187 may include through holes to receive the lift pins 109. A bellows assembly 131 is coupled between the substrate lift 130 and bottom surface 126 to provide a flexible seal which maintains the chamber vacuum during vertical motion of the substrate lift 130.

In some embodiments, the electrostatic chuck 150 includes gas distribution channels 138 extending from a lower surface of the electrostatic chuck 150 (e.g., bottom surface of the cooling plate 136) to various openings in an upper surface of the electrostatic chuck 150. The gas distribution channels 138 are configured to provide backside gas, such as nitrogen (N) or helium (He), to the top surface of the electrostatic chuck 150 to act as a heat transfer medium. The gas distribution channels 138 are in fluid communication with the backside gas supply 141 via gas conduit 142 to control the temperature and/or temperature profile of the electrostatic chuck 150 during use.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., bias power supply 117) to the one or more electrodes 154 within the electrostatic chuck 150 to attract ions from the plasma towards the substrate 122.

Figure 2:
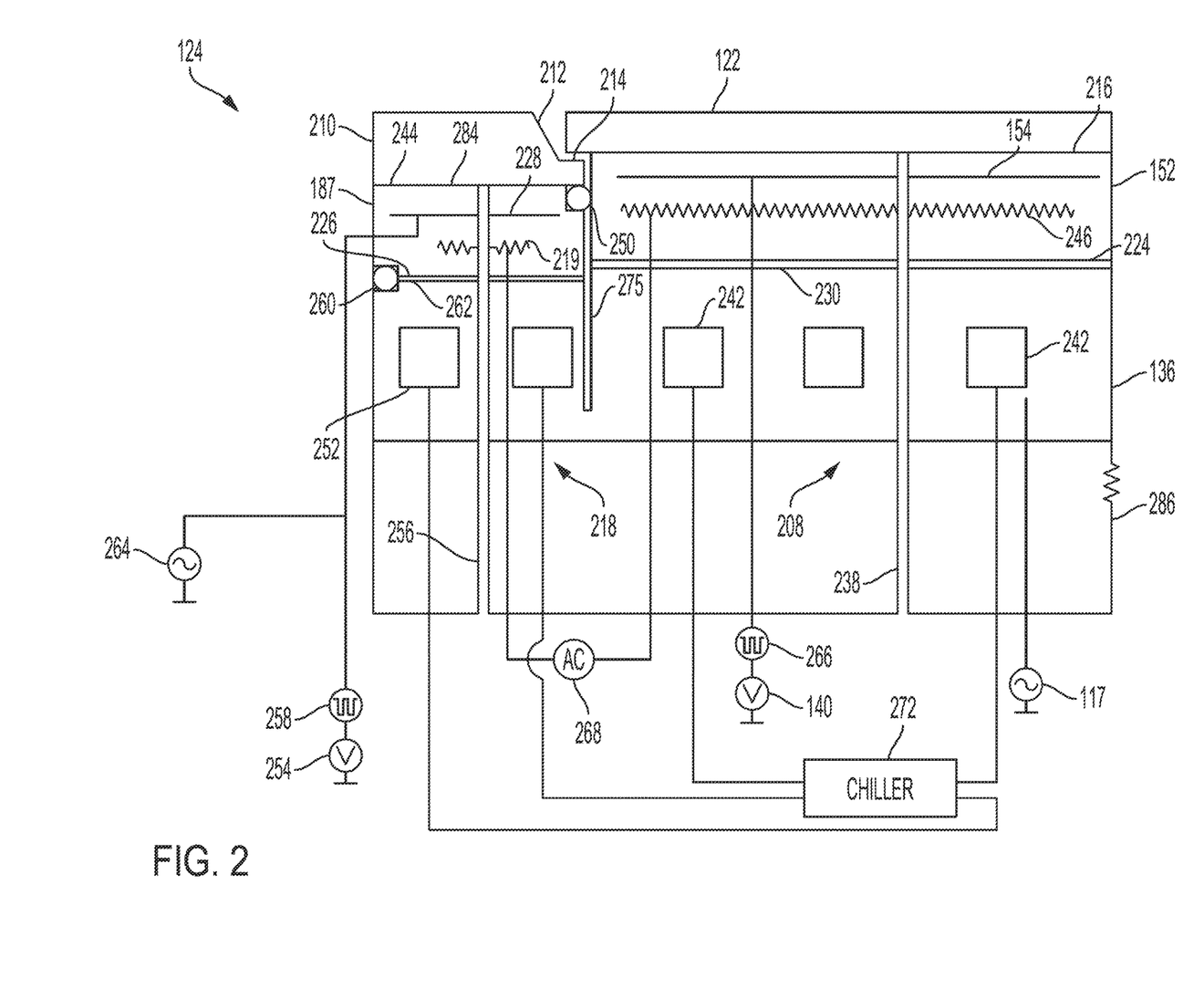
FIG. 2 depicts a schematic partial side view of a substrate support in accordance with at least some embodiments of the present disclosure.

FIG. 2 depicts a schematic partial side view of a substrate support in accordance with at least some embodiments of the present disclosure. The ceramic plate 152 includes a first side 216 configured to support a substrate 122 and a second side 224 opposite the first side 216. The ceramic plate 152 includes one or more electrodes 154 embedded therein. The one or more electrodes 154 may be monopolar or bipolar. In some embodiments, the ceramic plate 152 provides Coulombic chucking. In some embodiments, the ceramic plate 152 provides Johnsen-Rahbek chucking. In some embodiments, the one or more electrodes 154 comprise an upper electrode, a lower electrode, and a plurality of posts electrically coupled to the upper and lower electrodes. In some embodiments, the ceramic plate 152 includes one or more heating elements 246 embedded therein to control a temperature of the ceramic plate 152. In some embodiments, the ceramic plate 152 is made of aluminum nitride (AlN) or aluminum oxide ($Al_2O_3$).

A ceramic ring 187 is disposed about the ceramic plate 152 with a gap therebetween. The ceramic ring 187 includes a first side 244 and a second side 226 opposite the first side 244. In some embodiments, the first side 244 is an upper side. In some embodiments, the ceramic ring 187 includes one or more chucking electrodes 228 embedded therein. The one or more chucking electrodes 228 may be monopolar or bipolar. In some embodiments, the ceramic ring 187 provides Coulombic chucking. In some embodiments, the ceramic ring 187 provides Johnsen-Rahbek chucking. An edge ring 210 is disposed on the ceramic ring 187. In some embodiments, the edge ring 210 is made of silicon (Si). In some embodiments, at least one of the first side 244 of the ceramic ring 187 or the lower surface of the edge ring 210 are polished to enhance thermal coupling therebetween. In some embodiments, at least one of the first side 244 of the ceramic ring 187 or the lower surface of the edge ring 210 includes surface contouring, for example peaks, valleys, channels, or the like, to enhance thermal coupling therebetween by facilitating the distribution and/or flow of backside gas from the backside gas supply 141 into the interstitial space between the ceramic ring 187 and the edge ring 210 (e.g., via a second gas channel 256 discussed below). In some embodiments, a thermal gasket 284 may be disposed between the edge ring 210 and the ceramic ring 187 to enhance thermal coupling therebetween. The one or more chucking electrodes 228 are coupled to a chucking power supply 254 to hold the edge ring 210. In some embodiments, an outer diameter of the edge ring 210 is similar to an outer diameter of the ceramic ring 187. In some embodiments, an outer diameter of the edge ring 210 is greater than an outer diameter of the ceramic ring 187. The edge ring 210 includes an angled inner surface 212 disposed between an uppermost surface of the edge ring 210 and a second upper surface 214. In some embodiments, the ceramic ring 187 is made of aluminum nitride (AlN) or aluminum oxide ($Al_2O_3$).

In some embodiments, the bias power supply 117 is electrically coupled to the cooling plate 136 to create a same bias voltage on the substrate 122 and the edge ring 210. In operation, the bias power supply 117 applied on the cooling plate 136 creates a sheath in between the substrate 122 and the plasma 102. As a result, ions from the plasma 102 are attracted to the substrate 122 that is biased, and the ions accelerate through the sheath perpendicular to equipotential lines within the sheath. When the edge ring 210 erodes over time due to processing, a shape of the sheath bends proximate an edge of the substrate 122 leading to non-uniform processing of the substrate 122.

For a minimum impact on the substrate 122 and direct voltage control, the one or more chucking electrodes 228 are coupled to a negative pulsed DC power source 258. The negative pulsed DC power source 258 is configured to provide a power profile to correct sheath bending and maintain a substantially flat sheath profile across the substrate 122. In some embodiments, the one or more chucking electrodes 228 are disposed less than 0.3 mm from a bottom of the edge ring 210 to provide efficient coupling of the negative pulsed DC power to the edge ring 210. In some embodiments, the one or more electrodes 154 of the ceramic plate 152 are coupled to a negative pulsed DC power source 266. The negative pulsed DC power source 266 is configured to provide a power profile to correct sheath bending and maintain a substantially flat sheath profile across the substrate 122 independently of the negative pulsed DC power source 258. In some embodiments, an RF power source 264 is coupled to the one or more chucking electrodes 228 to provide RF bias power to the ceramic ring 187 independent from the bias power supply 117 for additional sheath control.

The ceramic ring 187 includes a heating element 219 embedded in the ceramic ring 187. The heating element 219 is coupled to a power source 268 (e.g., an AC power source) to heat the heating element 219. In some embodiments, a temperature probe is embedded within or otherwise coupled to the ceramic ring 187 to monitor and control a temperature of the ceramic ring 187 by controlling the power applied to the heating element 219 by the power source 268. In some embodiments, the chucking electrode 228 is disposed between the first side 244 and the heating element 219. In some embodiments, a heating element 246 is embedded in the ceramic plate 152 to heat the ceramic plate 152. The heating element 246 may be coupled to the power source 268 or another power source. The ceramic ring 187 is spaced apart from the ceramic plate 152 to prevent arcing.

In some embodiments, an outer diameter of the radially inner portion 208 of is substantially equal to an outer diameter of the ceramic plate 152. In some embodiments, a thickness of the ceramic ring 187 from the first side to the second side is advantageously greater than a thickness of the ceramic plate 152 from the first side to the second side to reduce a global impact of the sheath over the substrate when separate RF power is applied to the chucking electrode 228. In some embodiments, the radially inner portion 208 is raised with respect to the radially outer portion 218 to provide room for a thicker ceramic ring 187 or to provide room for the edge ring 210.

The ceramic ring 187 and the ceramic plate 152 are coupled to the cooling plate 136 to control temperature of the ceramic ring 187 and the ceramic plate 152. In some embodiments, the cooling plate 136 is made of an electrically conductive material, for example, aluminum (Al). The cooling plate 136 is coupled to the second side 224 of the ceramic plate 152 and the second side 226 of the ceramic ring 187. In some embodiments, the cooling plate 136 rests on an insulator plate 286. In some embodiments, the insulator plate 286 is made of aluminum oxide ($Al_2O_3$) or polyphenylene sulfide (PPS).

The cooling plate 136 includes a radially inner portion 208 and a radially outer portion 218. A thermal break 275 is disposed between the radially inner portion 208 and the radially outer portion 218 to provide dual heating zones of the cooling plate 136. In some embodiments, the thermal break 275 comprises an annular channel that extends from an upper surface of the cooling plate 136 to a location between the upper surface of the cooling plate 136 and the lower surface of the cooling plate 136. The radially inner portion 208 includes first coolant channels 242. The first coolant channels 242 are configured to flow a coolant having a first temperature therethrough to cool the ceramic plate 152. The radially outer portion 218 includes second coolant channels 252 in the radially outer portion 218 configured to circulate a coolant having a second temperature therethrough to cool the ceramic ring 187. In some embodiments, the first temperature is less than the second temperature. In some embodiments, the first coolant channels 242 are fluidly independent from the second coolant channels 252. In some embodiments, the thermal break 275 extends from the upper surface of the cooling plate 136 to a location beyond the first coolant channels 242 and the second coolant channel 252 for increased thermal decoupling between the radially inner portion 208 and the radially outer portion 218.

The first coolant channels 242 and the second coolant channels 252 are coupled to a chiller 272 configured to recirculate a coolant therethrough. In some embodiments, the ceramic ring 187 is spaced apart from the radially inner portion 208 of the cooling plate 136 to prevent thermal coupling therebetween. In some embodiments, the ceramic plate 152 is spaced apart from the radially outer portion 218 of the cooling plate 136 to prevent thermal coupling therebetween.

In some embodiments, a bonding layer 230 is disposed between the ceramic plate 152 and the radially inner portion 208 of the cooling plate 136. The bonding layer 230 is configured to provide improved thermal coupling between the radially inner portion 208 and the ceramic plate 152. In some embodiments, the bonding layer 230 comprises silicone. In some embodiments, the bonding layer 230 has a thickness of about 0.1 mm to about 0.4 mm. In some embodiments, the bonding layer 230 has a thermal conductivity of about 0.2 W/mK to about 1.2 W/mk. In some embodiments, a bonding layer 262 is disposed between the ceramic ring 187 and the radially outer portion 218. In some embodiments, the bonding layer 262 is similar to bonding layer 230.

In some embodiments, an o-ring 250 is disposed between the ceramic plate 152 and the ceramic ring 187 to provide a seal for the backside gas and to provide a seal against plasma 102 from eroding the bonding layer 262 and the bonding layer 230. In some embodiments, the o-ring 250 is disposed in an upper inner notch of the ceramic ring 187. In some embodiments, an o-ring 260 is disposed between the ceramic ring 187 and the cooling plate 136 to provide a seal for the backside gas and to provide a seal against plasma 102 from eroding the bonding layer 262. In some embodiments, the o-ring 260 is disposed in at least one of a lower outer notch of the ceramic ring 187 or an upper outer notch of the cooling plate 136.

In some embodiments, as shown in FIG. 2, the gas distribution channels 138 include a first gas channel 238 that extends from a bottom of the radially outer portion 218 to the first side 216, or top surface, of the ceramic plate 152 via the insulator plate 286, the radially inner portion 208 of the cooling plate 136, and the ceramic plate 152. In some embodiments, the gas distribution channels 138 include a second gas channel 256 that extends through the insulator plate 286, through the radially outer portion 218 of the cooling plate 136, and through the ceramic ring 187 to the first side 244 of the ceramic ring 187. The first gas channel 238 and the second gas channel 256 are configured to provide backside gas, such as nitrogen (N) or helium (He), to the top surface of the ceramic plate 152 and the ceramic ring 187, respectively, to act as a heat transfer medium. In some embodiments, the first gas channel 238 and the second gas channel 256 are fluidly independent within the substrate support 124 to provide independent temperature control to the substrate 122 and the edge ring 210.

Figure 3:
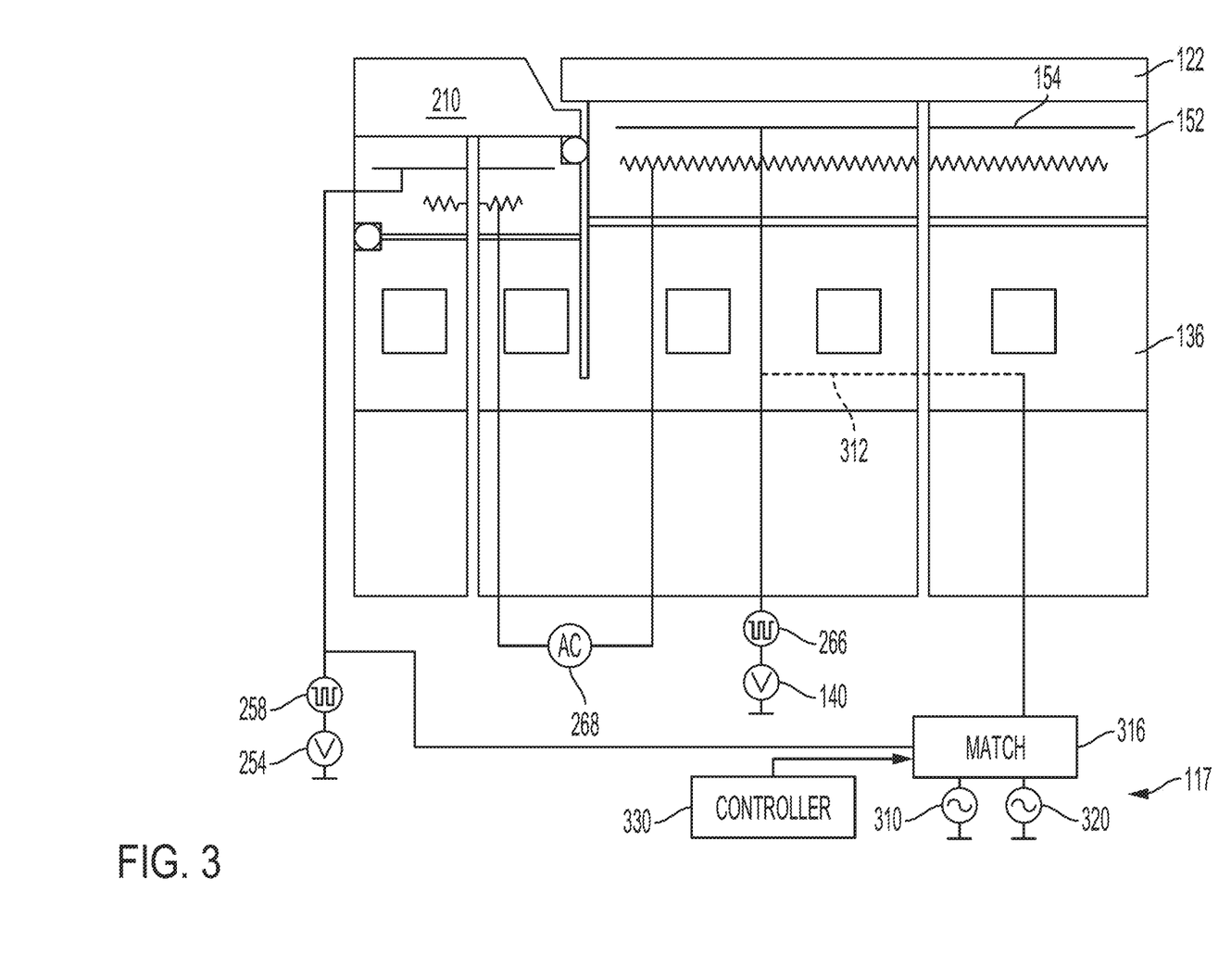
FIG. 3 depicts a schematic partial side view of a substrate support in accordance with at least some embodiments of the present disclosure.

FIG. 3 depicts a schematic partial side view of a substrate support in accordance with at least some embodiments of the present disclosure. In some embodiments, the bias power supply 117 is optionally electrically coupled to the one or more electrodes 154 of the ceramic plate 152 via conduit 312 to provide RF power to the one or more electrodes 154. In some embodiments, the bias power supply 117 includes a first RF source 310 and a second RF source 320. In some embodiments, the first RF source 310 provides RF power at a first frequency different than a second frequency of RF power provided by the second RF source 320. The first RF source 310 and the second RF source 320 are coupled to a match network 316. In some embodiments, the match network 316 is the RF match network 116, that, in some embodiments, is configured to adjust the matching of the impedance of the first RF source 310 and the second RF source 320. In some embodiments, the match network 316 is configured to split RF power from the first RF source 310 and the second RF source 320 to each of ceramic plate 152 and the ceramic ring 187. A controller 330 is coupled to the match network 316 to control the distribution of power from the first RF source 310 and the second RF source 320. In some embodiments, the match networks 316, and/or the controller 330 comprise a central processing unit (CPU), a plurality of support circuits, and a memory.

Figure 4:
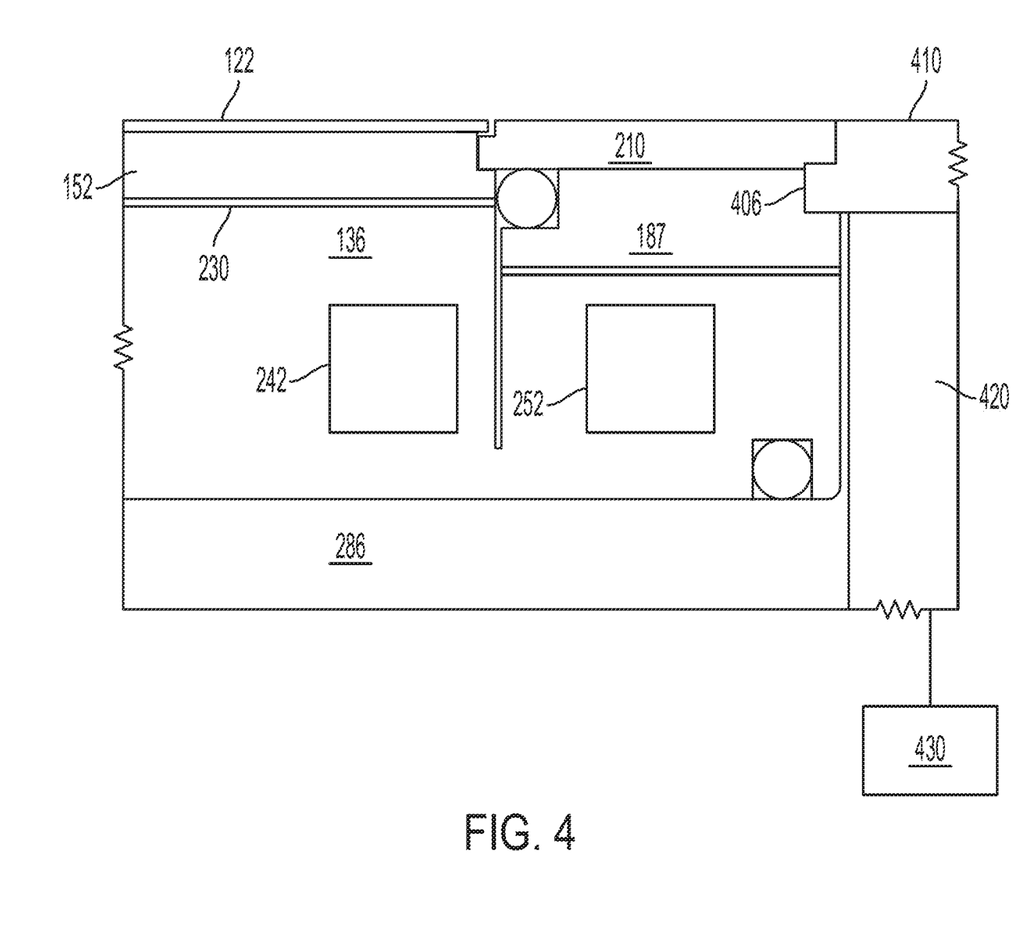
FIG. 4 depicts a simplified schematic partial side view of a substrate support in accordance with at least some embodiments of the present disclosure.

FIG. 4 depicts a simplified schematic partial side view of a substrate support in accordance with at least some embodiments of the present disclosure. In some embodiments, a second ceramic ring 410 is disposed about the edge ring 210. In some embodiments, the second ceramic ring 410 is made of quartz. In some embodiments, the second ceramic ring 410 is disposed about both the ceramic ring 187 and the edge ring 210. In some embodiments, the second ceramic ring 410 rests on a third ceramic ring 420. The third ceramic ring 420 is disposed about the cooling plate 136. In some embodiments, the third ceramic ring 420 is made of quartz. In some embodiments, the ceramic ring 187 may include through holes to receive the lift pins 109 to raise or lower the edge ring 210. In some embodiments, as shown in FIG. 4, the third ceramic ring 420 is coupled to an actuator 430 for raising or lowering the at least one of the second ceramic ring 410 or the edge ring 210 for ease of removal from the chamber 100. In some embodiments, the second ceramic ring 410 includes an inner lip 406 on which the edge ring 210 rests. In these embodiments, the third ceramic ring 420, when raised, raises both the second ceramic ring 410 and the edge ring 210 in unison.

While the foregoing is directed to embodiments of the present disclosure, other and further embodiments of the disclosure may be devised without departing from the basic scope thereof.

The invention claimed is:

1. A substrate support for use in a substrate processing chamber, comprising: a ceramic plate having a first side configured to support a substrate and a second side opposite the first side, wherein the ceramic plate includes an electrode embedded in the ceramic plate; a ceramic ring disposed about the ceramic plate and having a first side and a second side opposite the first side, wherein the ceramic ring includes a chucking electrode and a heating element embedded in the ceramic ring, wherein the ceramic ring includes an upper inner notch, wherein the upper inner notch includes an o-ring to provide a seal between the ceramic ring and the ceramic plate, and wherein a second o-ring is disposed between the ceramic ring and a cooling plate at a location radially outward of the ceramic plate; and the cooling plate is coupled to the second side of the ceramic plate and the second side of the ceramic ring, wherein the cooling plate includes a radially inner portion, a radially outer portion, and a thermal break disposed therebetween.

2. The substrate support of claim 1, further comprising an edge ring disposed on the ceramic ring, and wherein a radially innermost surface of the edge ring is disposed radially outward of the thermal break.

3. The substrate support of claim 1, further comprising a first gas channel extending through the ceramic plate, and a second gas channel extending through the ceramic ring from the first side to the second side.

4. The substrate support of claim 1, wherein the radially inner portion is raised with respect to the radially outer portion.

5. The substrate support of claim 1, wherein the electrode is coupled to a negative pulsed DC power source.

6. The substrate support of claim 1, wherein an outer diameter of the radially inner portion of the cooling plate is substantially equal to an outer diameter of the ceramic plate.

7. The substrate support of claim 1, further comprising a bonding layer disposed between the ceramic ring and the cooling plate.

8. The substrate support of claim 1, wherein a thickness of the ceramic ring from the first side to the second side is greater than a thickness of the ceramic plate from the first side to the second side.

9. The substrate support of claim 1, wherein the thermal break comprises an annular channel that extends from an upper surface of the cooling plate towards a lower surface of the cooling plate.

10. A substrate support for use in a substrate processing chamber, comprising: a ceramic plate having a first side configured to support a substrate and a second side opposite the first side, wherein the ceramic plate includes an electrode and a heating element embedded in the ceramic plate, and wherein the ceramic plate includes a first gas channel extending from the first side to the second side; a ceramic ring disposed about the ceramic plate and having a first side and a second side opposite the first side, wherein the ceramic ring includes a chucking electrode and a heating element embedded in the ceramic ring, and wherein the ceramic ring includes a second gas channel extending through the ceramic ring and is spaced apart from the ceramic plate; an edge ring disposed on the ceramic ring; and a cooling plate coupled to the second side of the ceramic plate and the second side of the ceramic ring, wherein an o-ring is disposed between the ceramic ring and the cooling plate at a location radially outward of the ceramic plate.

11. The substrate support of claim 10, wherein the cooling plate includes a radially inner portion and a radially outer portion and a thermal break disposed therebetween.

12. The substrate support of claim 11, wherein the cooling plate includes first coolant channels in the radially inner portion configured to circulate a coolant and second coolant channels in the radially outer portion configured to circulate a coolant, wherein the first coolant channels are fluidly independent from the second coolant channels.

13. The substrate support of claim 10, further comprising a second ceramic ring disposed about both the ceramic ring and the edge ring.

14. The substrate support of claim 13, further comprising a third ceramic ring to support the second ceramic ring, wherein the third ceramic ring is configured to raise the second ceramic ring and the edge ring when the third ceramic ring is raised.

15. A process chamber, comprising: a chamber body having the substrate support of claim 1 disposed within an inner volume of the chamber body.

16. The process chamber of claim 15, wherein the chucking electrode embedded in the ceramic ring is coupled to a negative pulsed DC power source.

17. The process chamber of claim 16, wherein the electrode of the ceramic plate is coupled to a negative pulsed DC power source.

18. The process chamber of claim 16, wherein the electrode of the ceramic plate is coupled to an RF power source.

19. The process chamber of claim 16, further comprising a match network coupled to the electrode of the ceramic plate and the chucking electrode of the ceramic ring.

* * * * *